(12) United States Patent
Chang et al.

(10) Patent No.: US 6,894,864 B2
(45) Date of Patent: May 17, 2005

(54) PORTABLE INFORMATION STORAGE DEVICE

(75) Inventors: Chin-Lung Chang, Taipei Hsien (TW); Hui-Ming Chu, Taipei Hsien (TW)

(73) Assignee: Wistron Corp. (TW)

( * ) Notice: Subject to any disclaimer, the term of this patent is extended or adjusted under 35 U.S.C. 154(b) by 251 days.

(21) Appl. No.: 10/268,696

(22) Filed: Oct. 11, 2002

(65) Prior Publication Data

US 2004/0017635 A1 Jan. 29, 2004

(30) Foreign Application Priority Data

Jul. 26, 2002 (TW) ..................................... 91211540 U

(51) Int. Cl.⁷ ............................................. G11B 17/00
(52) U.S. Cl. ................................................. 360/97.01
(58) Field of Search ....................... 360/97.01; 361/681, 361/683, 686, 687, 56

(56) References Cited

U.S. PATENT DOCUMENTS 6,522,534 B1 * 2/2003 Wu ............................ 361/686
2004/0017636 A1 * 1/2004 Chang et al. ............. 360/97.01
2004/0017637 A1 * 1/2004 Chang et al. ............. 360/97.01
2004/0125522 A1 * 7/2004 Chiu et al. .................... 361/56

FOREIGN PATENT DOCUMENTS

JP           2000171724 A  *  6/2000

* cited by examiner

Primary Examiner—Tianjie Chen
(74) Attorney, Agent, or Firm—Michael Bednarek; Pillsbury Winthrop Shaw Pittman LLP

(57) ABSTRACT

A portable storage device, such as a USB portable disk drive, comprises a main body and a flexible casing. The main body has a connecting portion and a lamp portion. The flexible casing is attached to the main body and encircles the connecting portion. When the flexible casing is compressed and situated at a first position, the connecting portion is exposed outside the flexible casing, and the portable storage device is at a status of being used. When the flexible casing is not compressed and is situated at a second position, the connecting portion is hidden in the flexible casing, and the portable storage device is at a status of being housed. The lamp portion can be a light emitting diode (LED) for showing the operating status of the portable storage device, and a light-directing portion can be located at the outside of the lamp portion.

7 Claims, 4 Drawing Sheets

PORTABLE INFORMATION STORAGE DEVICE

BACKGROUND OF THE INVENTION

1. Field of the Invention

The present invention relates to a portable storage device, and particularly to a USB portable disk drive (Handy Drive) having no separated covering and being able to be identified from various angles.

2. Description of the Prior Art

As computer technology advances, there is a trend to develop smaller and portable storage devices. Now, various portable storage devices, such as a portable disk drive, are common in the market, and most of them are connected to computers via universal serial bus (USB) interfaces.

FIG. 1 is a perspective diagram of a conventional USB portable disk drive 500. The drive 500 comprises a main body 510 having a storage portion, such as a flash memory, and a covering 520 separated form the main body for covering a USB terminal 515. In addition, the main body 510 further comprises an indicator light 530, such as a light-emitting diode (LED), for showing the operating status of the portable disk drive 500. Before using the USB portable disk drive 500, the user has to remove the covering 520 and plug the USB terminal 515 into a USB socket of the computer. When data is accessed and transmitted between the drive 500 and computer, the indicator light 530 will be turned on so as to show the USB portable disk drive 500 is at a status of being used. When finishing the use of the drive 500, the user can cover the USB terminal 515 with the covering 520 so as to protect the USB terminal 515 and keep it from dust. In addition, a hanging portion (not shown), such as a hooking ring or a hanging hole, can be installed on the main body 510 or the covering 520 so that the user can hang the drive 500 on the neck and carry it with him or her.

However, the conventional USB portable disk drive 500 has the following drawbacks when it is being used and carried.

First, the conventional USB portable disk drive 500 has a separated covering 520 for covering the USB terminal 515. When the user removes the covering 520 and uses the USB portable disk drive 500, he or she usually lays the covering 520 aside. Therefore, the user tends to lose the covering 520 for the carelessness especially when the USB portable disk drive 500 is repeatedly plugged into the computer for data accessing and taken out from the computer. Losing the covering 520 not only makes it impossible to keep the USB terminal 515 from the dust, but also damages the integrity of the external shape of the USB portable disk drive 500.

Furthermore, the indicator light 530 of the conventional USB portable disk drive 500 is a small LED, and therefore, no matter which position the LED is situated at, the light of the indicator light 530 cannot be easily identified from various angles. Particularly, when the computer system has various peripheral devices, the light emitted by the indicator light 530 will be affected by the surroundings or the other peripheral devices and cannot be easily identified. Consequently, the user tends to misjudge that the data accessing of the USB portable disk drive 500 is finished and then takes out the drive 500 when the drive 500 is still performing the data accessing so that the data accessing will be abnormally interrupted and the data may be damaged.

SUMMARY OF THE INVENTION

Therefore, the objective of the present invention is to provide a portable storage device so as to resolve the problems of the conventional USB portable disk drive. The portable storage device comprises a main body and a flexible casing attached to the main body. The flexible casing is compressible and its position relative to the main body can be changed. The flexible casing can function as a covering, and therefore, a separated covering can be avoided. Furthermore, by installing a light-directing device on the main body, the user can identify the light of the lamp portion from various angles when the portable storage device is being used, and the misjudging can be avoided so that the portable storage device will not be taken out when the data accessing is being performed.

The present invention relates to a portable storage device comprising a main body and a flexible casing. The main body has a connecting portion and a lamp portion. The lamp portion can be a light emitting diode (LED) for showing the operating status of the portable storage device. The flexible casing is attached to the main body and encircles the connecting portion. When the flexible casing is compressed and is situated at a first position, the connecting portion is exposed outside the flexible casing, and the portable storage device is at a status of being used. When the flexible casing is not compressed and is situated at a second position, the connecting portion is hidden in the flexible casing, and the portable storage device is at a status of being housed.

In the portable storage device of the invention, the connecting portion can be a universal serial bus (USB) terminal. Furthermore, the main body can have a light-directing portion located at the outside of the lamp portion for directing the light of the lamp portion to various angles so as to make it easy for the users to identify.

In addition, in the portable storage device of the invention, the main body further has a hanging portion for the user to hang the portable storage device on the neck and carry it with him or her. Besides, the flexible casing is made of flexible materials or translucent plastics and is compressible. The flexible casing also functions as a covering for covering the connecting portion so as to protect the connecting portion and keep it from the dust.

These and other objectives of the present invention will no doubt become obvious to those of ordinary skill in the art after having read the following detailed description of the preferred embodiment, which is illustrated in the various figures and drawings.

DETAILED DESCRIPTION OF THE PREFERRED EMBODIMENT

Figure 1:
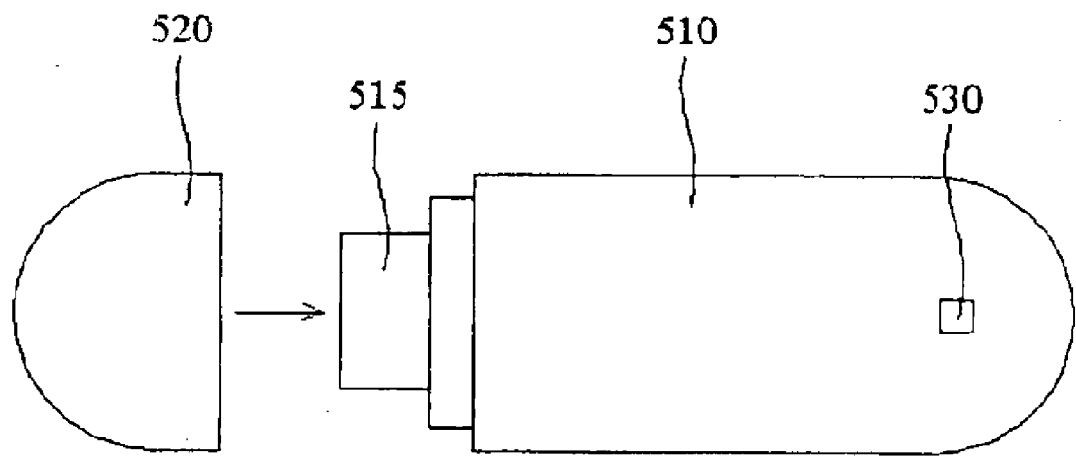
FIG. 1 is a perspective diagram of a conventional USB portable disk drive.
Figure 2A:
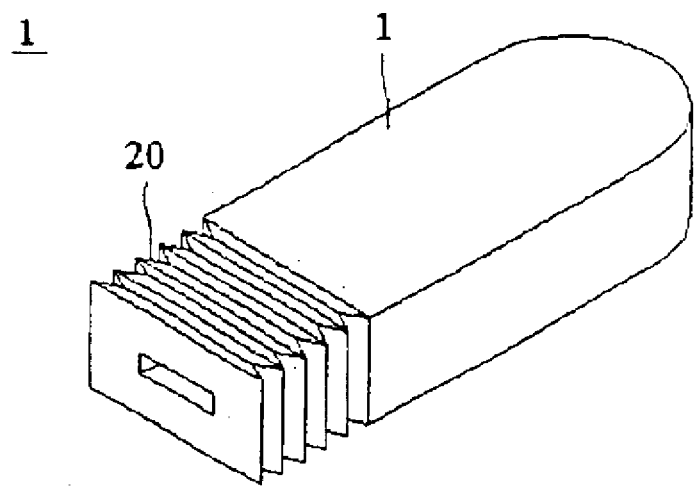
FIG. 2a is a perspective diagram of a portable storage device according to the invention at a status of being housed.
Figure 2B:
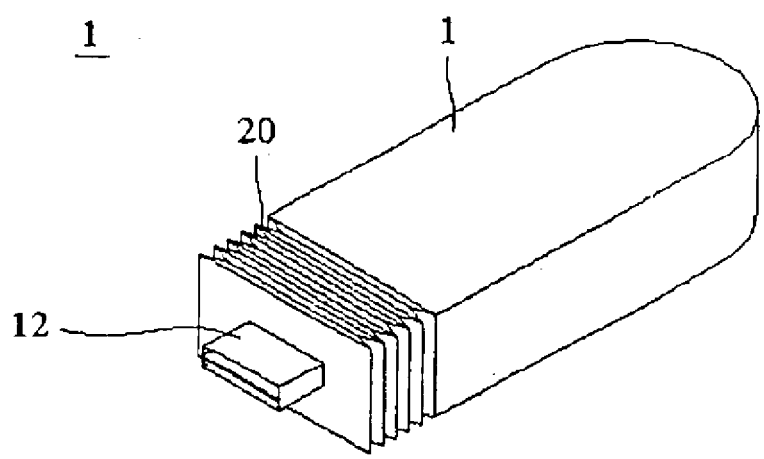
FIG. 2b is a perspective diagram of the portable storage device at a status of being used.
Figure 3:
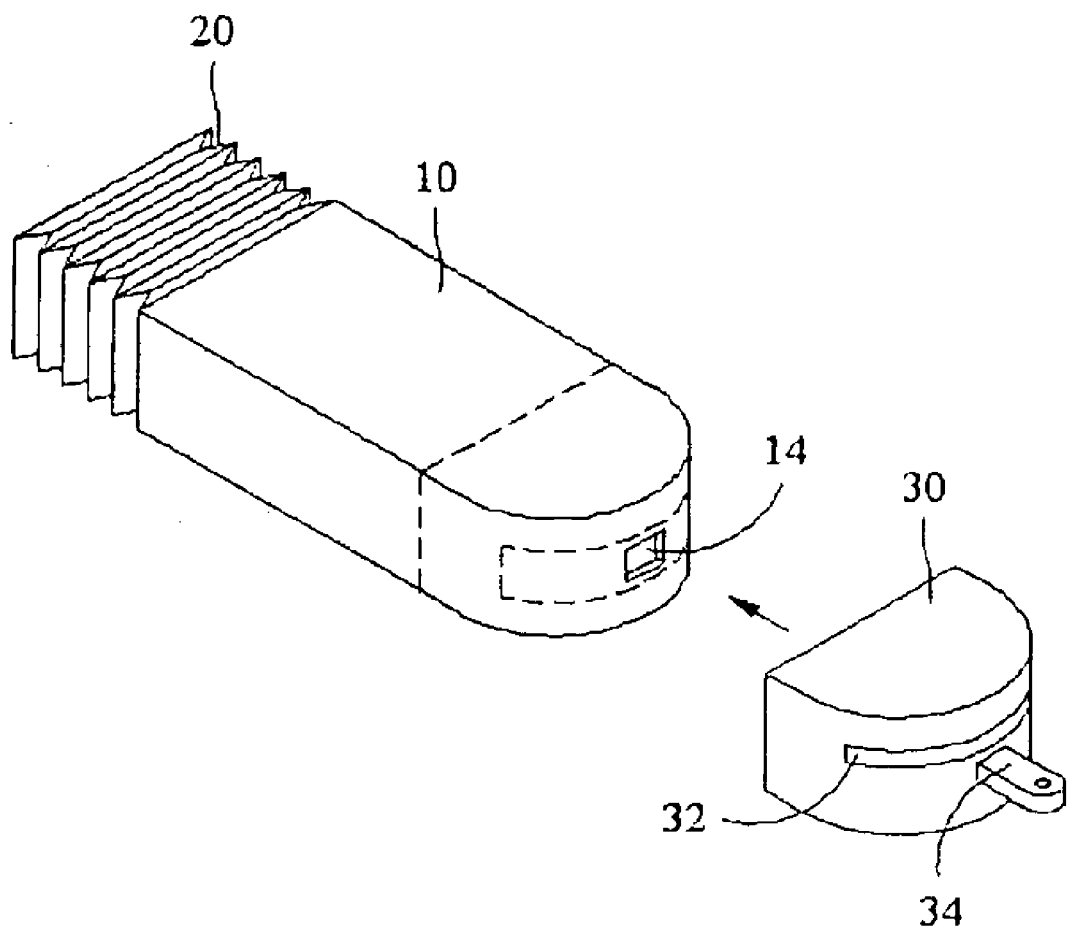
FIG. 3 is a perspective diagram showing the back end of the portable storage device.

Please refer to FIGS. 2a, 2b and 3. These figures illustrate the structure of an embodiment of a portable storage device according to the invention.

The portable storage device 1 comprises a main body 10 and a flexible casing 20. The main body 10 has a connecting portion 12, such as a USB terminal, installed at the front end of it, and the flexible casing 20 is connected to the main body 10 and encircles the connecting portion 12. The front end of the flexible casing 20 has an opening so that the connecting portion 12 can be exposed outside the opening. The flexible casing 20 is made of flexible materials or translucent plastics and is compressible. The flexible casing 20 also functions as a covering for protecting the connecting portion 12 and keeping it from the dust. As shown in FIG. 2a, when the flexible casing 20 is not compressed and is situated at a normal position (second position), the connecting portion 12 is hidden in the flexible casing 20, and the portable storage device 1 is at a status of being housed. As shown in FIG. 2b, when the flexible casing 20 is compressed and situated at a compressed position (first position), the connecting portion 12 is exposed outside the flexible casing 20, and the portable storage device is at a status of being used.

As shown in FIG. 3, the back end of the main body 10 has a lamp portion 14, such as a light emitting diode (LED), installed inside a housing for showing the operating status of the portable storage device 1. In addition, a light-directing portion 32 corresponding to the lamp portion 14 is installed on the housing 30 of the main body 10 and located outside the lamp portion 14 for directing the light of the lamp portion 14 to various angles so as to make it easy for the users to identify whether the lamp portion 14 is turned on or off. The main body 10 further comprises a hanging portion 34, such as a hanging hole, so that the user can hang the portable storage device 1 on the neck and carry it with him or her.

Figure 4A:
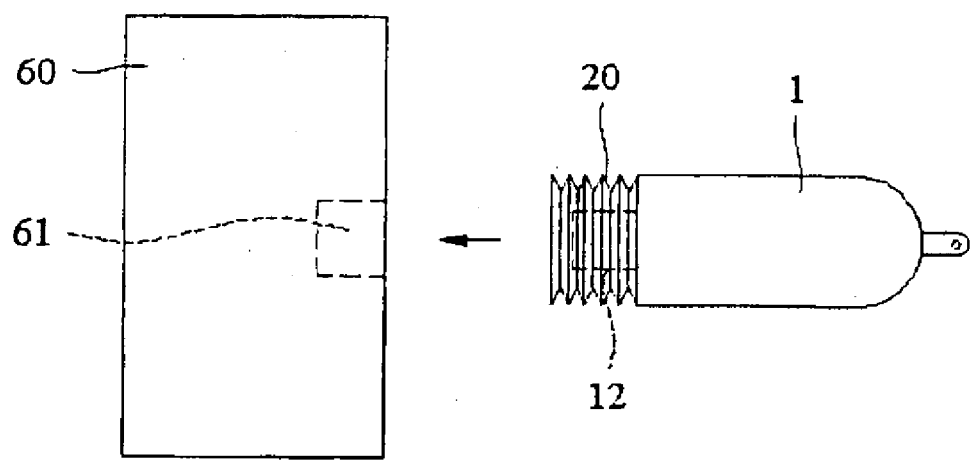
FIG. 4a is a perspective diagram of the portable storage device when it is not being used.
Figure 4B:
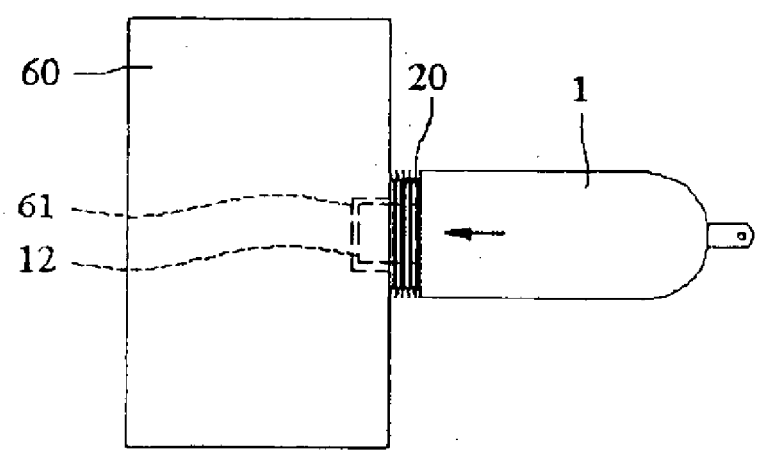
FIG. 4b is a perspective diagram of the portable storage device when it is being used.

Please refer to FIGS. 4a and 4b. They are perspective diagrams of the portable storage device 1 before and when it is being used. As shown in FIG. 4a, before the portable storage device 1 is inserted into a USB socket 61 of a computer 60 (or any other electronic devices have sockets corresponding to the connecting portion, such as a USB card-reading machine), the portable storage device 1 is not being used. Namely, the portable storage device 1 is at the status of being-housed, and the connecting portion 12 is hidden in the flexible casing 20. At the same time, the flexible casing 20 functions as a covering for protecting the connecting portion 12 and keeping it from the dust. Because the portable storage device 1 is not being used, the lamp portion 16 is off and is not emitting light.

When the user wants to use the portable storage device 1, the user only has to accurately push the portable storage device 1 toward the USB socket 61, as shown in FIG. 4b, so as to compress the flexible casing 20 and make the connecting portion 12 exposed outside the flexible casing 20 and directly inserted in the USB socket 61. At this time, the portable storage device 1 is at the status of being used, and the lamp portion 14 of the main body 10 is turned on, emitting light. The light-directing portion 32 will direct the light of the lamp portion 14 to various angles so as to make it easy for the users to identify.

When finishing the use of the portable storage device 1, the user only has to take out the portable storage device 1 from the USB socket 61, and the flexible casing 20 will return to the normal position, as shown in FIG. 4a, for its flexibility. Therefore, the connecting portion 12 is hidden in the flexible casing 20 again, and the flexible casing 20 functions as a covering for protecting the connecting portion 12 and keeping it from the dust.

It should be noticed that in the portable storage device 1 of the invention, the position of the lamp portion 14 is not limited to the back end of the main body 10 as described above. The position of the lamp portion 14 can be varied according to the different designs of the portable storage device 1, and the position of the light-directing portion 32 can be correspondingly varied according to the position of the lamp portion 14.

Furthermore, the hanging portion 34 of the invention is not limited to the structure as mentioned above. Other structures, such as a hanging hook or a hanging ring, can be applied to the hanging portion 34. As long as the operation of the flexible casing 20 is not affected, the hanging portion 34 also can be located at other positions of the portable storage device 1, not limited to the back end of the main body 10.

Besides, before using the portable storage device 1 of the invention, the user has to accurately push the portable storage device 1 toward the USB socket 61 so as to directly insert the connecting portion 12 into the USB socket 61. Therefore, the flexible casing 20 is preferably made of translucent materials so as to make it easy for the user to accurately and directly insert the connecting portion 12 into the USB socket 61 and to avoid the collision caused by the connecting portion 12 is not directly inserted into the USB socket 61 and knocks against the surroundings of the USB socket 61.

In the portable storage device of the present invention, the flexible casing 20 attached to the main body takes the place of the conventional covering, and therefore, a separated covering is avoided. Furthermore, by means of the light-directing portion 32, the light of the lamp portion 14 can be directed to various angles when the storage device is being used, and the user can easily identify the light of the lamp portion 14 from various angles, and the misjudging can be avoided so that the portable storage device 1 will not be taken out when the data accessing is being performed. Therefore, the present invention can resolve the problems caused by the conventional USB portable disk drive.

Those skilled in the art will readily observe that numerous modifications and alterations of the device may be made while retaining the teachings of the invention. Accordingly, the above disclosure should be construed as limited only by the metes and bounds of the appended claims

What is claimed is:

1. A portable information storage device comprising:
   a main body comprising a connecting portion and a lamp portion; and
   a flexible casing attached to the main body for encircling the connecting portion, when the flexible casing being compressed and situated at a first position, the connecting portion being exposed outside the flexible casing; when the flexible casing being not compressed and being situated at a second position, the connecting portion being hidden in the flexible casing.

2. The portable information storage device of claim 1, wherein the lamp portion is a light emitting diode (LED).

3. The portable information storage device of claim 1, wherein the main body further comprises a light-directing portion located at the outside of the lamp portion.

4. The portable information storage device of claim 1, wherein the connecting portion is a universal serial bus (USB) terminal.

5. The portable information storage device of claim 1, wherein the main body further comprises a hanging portion.

6. The portable information storage device of claim 1, wherein the flexible casing is made of flexible materials.

7. The portable information storage device of claim 1, wherein the flexible casing is made of translucent plastics.

* * * * *